US011489032B2

United States Patent
Hsieh (10) Patent No.: US 11,489,032 B2
(45) Date of Patent: Nov. 1, 2022

(54) DISPLAY PANEL AND DISPLAY DEVICE WITH LIGHT SHIELDING PORTIONS HAVING CURVED PROFILE

(71) Applicant: BOE TECHNOLOGY GROUP CO., LTD., Beijing (CN)

(72) Inventor: Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 203 days.

(21) Appl. No.: 16/652,576

(22) PCT Filed: Apr. 3, 2019

(86) PCT No.: PCT/CN2019/081196
§ 371 (c)(1),
(2) Date: Mar. 31, 2020

(87) PCT Pub. No.: WO2020/199147
PCT Pub. Date: Oct. 8, 2020

(65) Prior Publication Data
US 2021/0233986 A1    Jul. 29, 2021

(51) Int. Cl.
*H01L 27/32* (2006.01)
(52) U.S. Cl.
CPC ........ *H01L 27/3272* (2013.01); *H01L 27/326* (2013.01); *H01L 27/3234* (2013.01);
(Continued)
(58) Field of Classification Search
CPC ............. H01L 27/3272; H01L 27/3234; H01L 27/3246; H01L 27/3258; H01L 27/326; H01L 27/3276
See application file for complete search history.

(56) References Cited

U.S. PATENT DOCUMENTS 6,937,312 B2 * 8/2005 Kadotani .......... G02F 1/134363
349/141
10,831,069 B2 * 11/2020 Okita ................ G02F 1/133514
(Continued)

FOREIGN PATENT DOCUMENTS

| CN | 102206046 A | 10/2011 |
|---|---|---|
| CN | 103718069 A | 4/2014 |

(Continued)

OTHER PUBLICATIONS

PCT International Search Report, Application No. PCT/CN2019/081196, dated Dec. 12, 2019, 7 pages: with English translation.
(Continued)

*Primary Examiner* — Lex H Malsawma (74) *Attorney, Agent, or Firm* — Armstrong Teasdale LLP (57) ABSTRACT

The Embodiments of the present disclosure relate to a display panel and a display device. The display panel includes a plurality of wirings extending parallel to a display surface of the display panel, and a plurality of light shielding portions extending parallel to the display surface, wherein projections of at least two wirings of the plurality of wirings with parallel extending directions on the display surface are within a projection of a same light shielding portion on the display surface, wherein at least a portion of each light-shielding portion has a curved profile along the extending direction.

20 Claims, 10 Drawing Sheets

(52) U.S. Cl.
CPC ...... *H01L 27/3246* (2013.01); *H01L 27/3258* (2013.01); *H01L 27/3276* (2013.01)

(56) References Cited

U.S. PATENT DOCUMENTS

| | | | |
|---|---|---|---|
| 2007/0263159 A1* | 11/2007 | Kobayashi | G02F 1/133512 349/153 |
| 2014/0146094 A1* | 5/2014 | Koide | G02F 1/136286 345/690 |
| 2016/0187717 A1* | 6/2016 | Hosokawa | G02F 1/13394 349/110 |
| 2017/0192279 A1* | 7/2017 | Maede | G02F 1/13394 |
| 2018/0348555 A1* | 12/2018 | Okita | G02F 1/1343 |
| 2019/0278129 A1* | 9/2019 | Zhu | G02F 1/13306 |

FOREIGN PATENT DOCUMENTS

| | | |
|---|---|---|
| CN | 108682299 A | 10/2018 |
| JP | 2006243261 A | 9/2006 |

OTHER PUBLICATIONS

PCT Written Opinion, Application No. PCT/CN2019/081196, dated Dec. 13, 2019, 7 pages : with English translation of relevant part.

\* cited by examiner

DISPLAY PANEL AND DISPLAY DEVICE WITH LIGHT SHIELDING PORTIONS HAVING CURVED PROFILE

CROSS REFERENCE TO RELATED APPLICATIONS

This patent application is a National Stage Entry of PCT/CN2019/081196 filed on Apr. 3, 2019, the disclosure of which is incorporated by reference herein in its entirety as part of the present application.

BACKGROUND

Embodiments of the present disclosure relate to a field of display technology, and in particular, to a display panel and a display device.

Mobile terminals such as mobile phones typically include a display panel and an imaging element. With the progress of society and the continuous improvement of living standards, people's requirements for mobile terminals are also increasing. The screen ratio of a mobile terminal (the ratio of the area of the display region of the display panel to the area of the surface of the entire mobile terminal) is constantly increasing, and it is moving towards full screen display.

BRIEF DESCRIPTION

An aspect of the present disclosure provides a display panel including a plurality of wirings extending parallel to a display surface of the display panel, and a plurality of light shielding portions extending parallel to the display surface, wherein projections of at least two wirings of the plurality of wirings with parallel extending directions on the display surface are within a projection of a same light shielding portion on the display surface, wherein at least a portion of each light-shielding portion has a curved profile along the extending direction.

In some embodiments, the at least two wirings include a gate line or a data line.

In some embodiments, the curved profile has a wave shape along the extending direction.

In some embodiments, a curvature radius of each wave unit of the wave shape at a peak is in a range of approximately 5-10 µm.

In some embodiments, a width of each wave unit of the wave shape is in a range of approximately 4-7 µm.

In some embodiments, each light shielding portion has a symmetrical shape with respect to an axis parallel to the extending direction.

In some embodiments, a peak of the wave unit of one of two adjacent light shielding portions with parallel extending directions is not aligned with a peak of the wave unit of the other one of the two adjacent light shielding portions in a direction perpendicular to the extending directions.

In some embodiments, a peak of the wave unit of one of the two adjacent light shielding portions with parallel extending directions is aligned with a trough of the wave unit of the other one of the two adjacent light shielding portions in a direction perpendicular to the extending directions.

In some embodiments, a distance between two adjacent light shielding portions with parallel extending directions is greater than approximately 80 µm.

In some embodiments, a distance between two adjacent light shielding portions with parallel extending directions is greater than approximately 120 µm.

In some embodiments, the display panel includes a first area and a second area, wherein a transmittance of the first area is greater than a transmittance of the second area, and wherein the light shielding portion is disposed only in the first area.

In some embodiments, a pixel density of the first area is less than a pixel density of the second area.

In some embodiments, the at least two wirings include a first wiring and a second wiring extending in a first direction, and the second wiring is more adjacent to the first wiring in the first area in a second direction perpendicular to the first direction than other wirings extending in the first direction.

In some embodiments, one of the first wiring and the second wiring is configured to provide a signal to a same pixel of the first area.

In some embodiments, the at least two wirings include a third wiring and a fourth wiring extending in the second direction, and the fourth wiring is more adjacent to the third wiring in the first area in a first direction than other wirings extending in the second direction.

In some embodiments, one of the third wiring and the fourth wiring is configured to provide a signal to a same pixel of the first area.

In some embodiments, the first wiring and the second wiring are one of a data line and a gate line, and the third wiring and the fourth wiring are the other one of the data line and the gate line.

In some embodiments, the display panel further includes an additional layer located in the second area and extending to the first area, wherein a projection of an edge of the additional layer close to the first area on the display surface is within a projection of the light shielding portion on the display surface.

In some embodiments, the display panel further includes a first substrate, and a thin film transistor located on the first substrate, wherein the light shielding portion is located between the thin film transistor and the first substrate, and a projection of the thin film transistor on the display surface is within a projection of the light shielding portion on the display surface.

In some embodiments, the display panel further includes a buffer layer on the light shielding portion, a planarization layer on the thin film transistor, an electrode layer on the planarization layer, a pixel-defining layer having an opening area on the electrode layer, and a light-emitting material layer in the opening area of the pixel-defining layer, wherein the additional layer includes at least one of the planarization layer and the pixel-defining layer.

Another aspect of the present disclosure provides a display device including the display panel according to any one of one or more embodiments of the present disclosure.

In some embodiments, the display device further includes an imaging element located on a side of the display panel away from the display surface, wherein the display panel has a first area and a second area, and a transmittance of the first area is greater than a transmittance of the second area, the light shielding portion is provided only in the first area, and an orthographic projection of the imaging element on the display panel is within the first area.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for the purpose of illustration of selected embodiments only, not for all possible implementations, and are not intended to limit the scope of the disclosure, wherein.

Corresponding reference numerals indicate corresponding parts or features throughout the several views of the drawings.

DETAILED DESCRIPTION

Various embodiments will now be described in detail with reference to the drawings, which are provided as illustrative examples of the disclosure so as to enable those skilled in the art to practice the disclosure. Notably, the figures and the examples below are not meant to limit the scope of the present disclosure. Where certain elements of the present disclosure may be partially or fully implemented using known components, only those portions of such known components that are necessary for an understanding of the present disclosure will be described, and the detailed descriptions of other portions of such known components will be omitted so as not to obscure the disclosure. Further, various embodiments encompass present and future known equivalents to the components referred to herein by way of illustration.

Figure 1A:
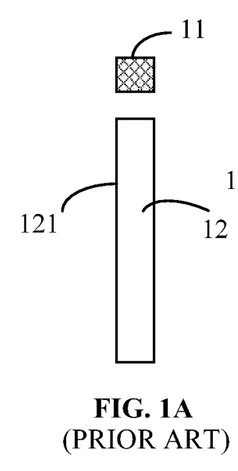
FIGS. 1A-1C schematically illustrate three relative positions of the imaging element with respect to the display panel.
Figures 1B, 1C:
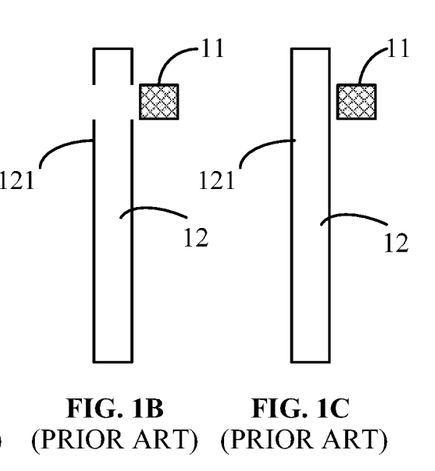

In the related art, an arranging position of an imaging element will affect the screen ratio of the mobile terminal. FIGS. 1A-1C schematically illustrate three relative positions of the imaging element with respect to the display panel. In the first configuration shown in FIG. 1A, an imaging element 11 is disposed on the periphery of the display panel 12, so the imaging element 11 occupies extra space, which is not conducive to increasing the screen ratio. In the second configuration shown in FIG. 1B, the imaging element 11 is disposed on the back of the display panel 12 (a side of the display panel away from the display surface 121), which may increase the screen ratio to a certain extent. However, such a configuration requires a blank area 13 (where no pixel is provided) at a position of the display panel 12 corresponding to the imaging element 11, and the imaging element 11 may capture an image of an object in front of the display panel 12 through the blank area 13. Although the second configuration may increase the screen ratio to a certain extent compared to the first configuration, it still cannot achieve full screen display. In the third configuration shown in FIG. 1C, similarly to the second configuration, the imaging element 11 is disposed on the back of the display panel 12, but the area of the display panel 12 corresponding to the imaging element 11 can still display an image by being at least partially transparent. In this case, the display panel includes a transparent display area 21 and a non-transparent display area 22, and the imaging element 11 is located at a position corresponding to the transparent display area 21 of the display panel. This may be achieved by reducing the ppi (pixels per inch) of the area corresponding to the imaging element 11 of the display panel 12 so that ambient light may pass through the display panel 12.

Figure 2:
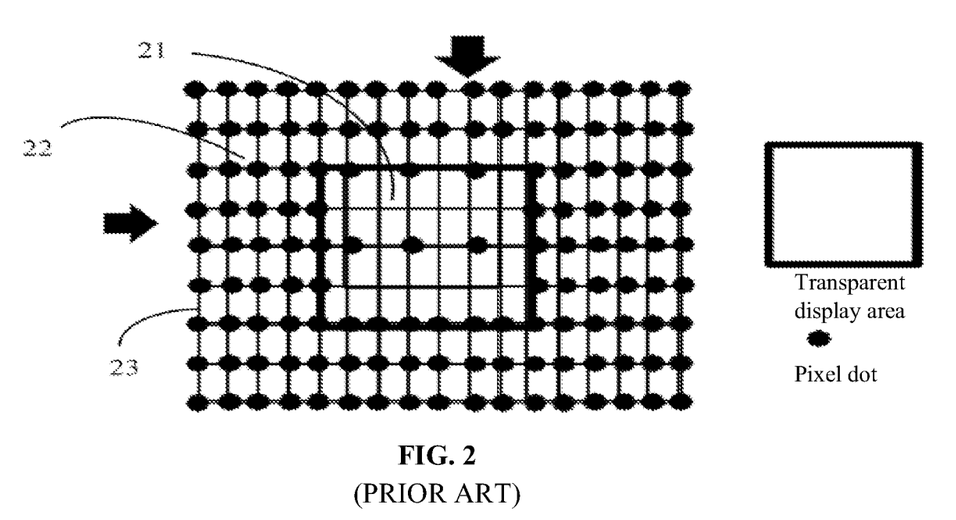
FIG. 2 is a schematic view of a partially transparent display panel in the related art.

FIG. 2 is a schematic view of a partially transparent display panel in the related art. As shown in FIG. 2, in order to achieve partial transparent display of the display panel, some pixels may be removed from the transparent display area 21 to reduce the ppi of the transparent display area 21 (the area enclosed by the thick solid line in FIG. 2). In FIG. 2, pixels may be schematically represented by pixel points. As an example, the number of pixels in the transparent display area 21 may be reduced to half of the pixels in the non-transparent display area 22. As a further example, in the transparent display area 21, rows/columns with pixels and rows/columns without pixels are arranged alternately each other. In the partially transparent display panel shown in FIG. 2, the wirings in the transparent display area 21 and the non-transparent display area 22 are arranged in exactly the same way, which results in that the wiring density in the transparent display area 21 is not reduced compared with that of the non-transparent display area 22, thereby adversely affecting the transparent display effect and the imaging quality of the imaging element to a certain extent.

Figure 3:
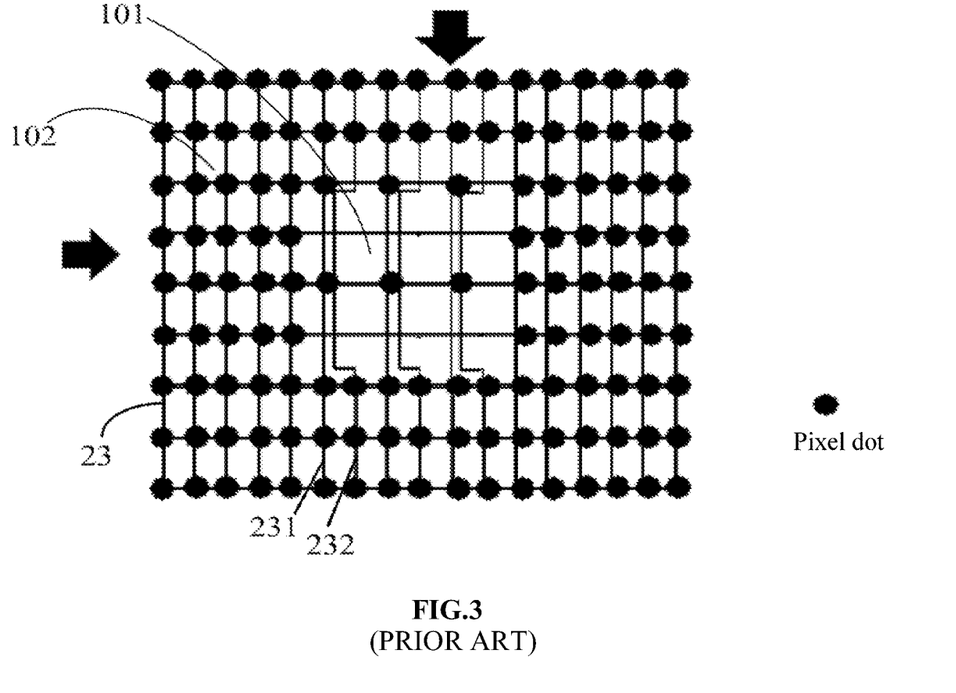
FIG. 3 is a schematic view of another partially transparent display panel in the related art.

FIG. 3 is a schematic view of another partially transparent display panel in the related art. As shown in FIG. 3, wirings 231 and 232 that supply signals to pixels of the transparent display area 21 and the non-transparent display area 22 are more adjacent to each other in the transparent display area 21. This configuration may improve the display effect and the imaging quality of the imaging element to a certain extent. However, since the distance between the two wirings 231 and 232 moving closer to each other in the transparent display area is usually small, and the smaller the gap, the easier it is to cause diffraction of the light passing through, so the display effect of the display panel and the imaging quality of the imaging element are also adversely affected.

Figure 4A:
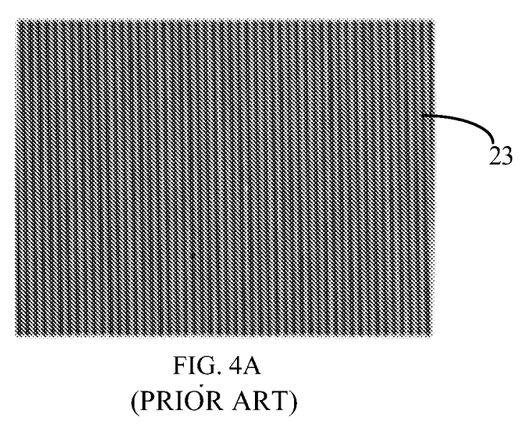
FIGS. 4A and 4B schematically illustrate the wirings arranged in the longitudinal direction and the imaging effect of the corresponding imaging element in the related art, respectively.
Figure 4B:
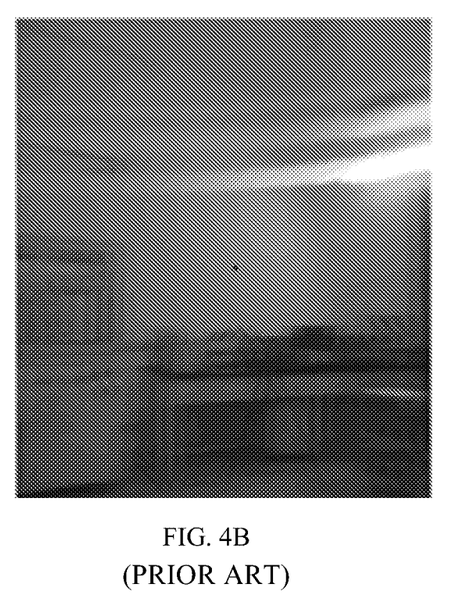

FIGS. 4A and 4B schematically illustrate wirings arranged in a longitudinal direction in the related art and imaging effect of the corresponding imaging element, respectively. As shown in FIGS. 4A and 4B, in the case where the wirings are arranged in parallel and densely, the sharpness of the image acquired by the imaging element will be affected, making the image quality deteriorated.

Figure 5A:
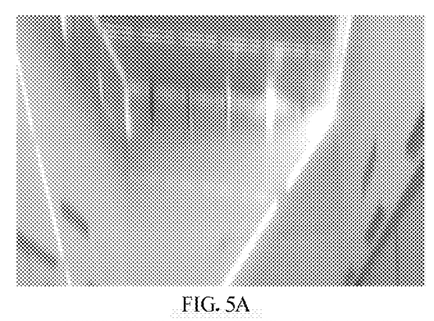
FIGS. 5A and 5B illustrate wirings having regular strip-shapes and arranged in parallel and imaging effect of the corresponding imaging element, respectively.
Figure 5B:
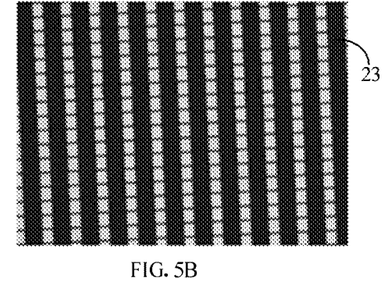
Figure 6A:
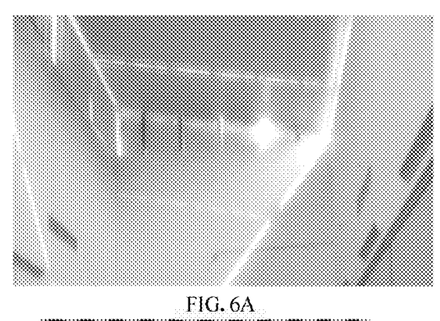
FIGS. 6A and 6B illustrate wirings having irregular strip-shapes and arranged in parallel and imaging result of corresponding imaging elements, respectively.
Figure 6B:
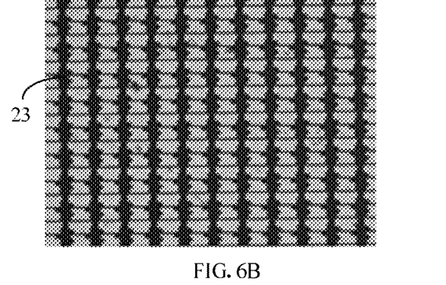

In addition, the inventors found that in addition to the density of the wirings, the shape of the wirings also affects the image quality acquired by the imaging element. FIGS. 5A and 5B illustrate wirings having regular strip-shapes and arranged in parallel and the imaging effect views of the corresponding imaging element, respectively. FIGS. 6A and 6B illustrate wirings having irregular strip-shapes and arranged in parallel and the imaging effect of the corresponding imaging element, respectively. As shown in FIGS. 5A and 5B, in the case where the wirings 21 are regularly strip-shaped wirings, the imaging effect is relatively poor. As shown in FIGS. 6A and 6B, in the case where the wirings 21 are irregularly strip-shaped wirings, the imaging effect is improved compared to the regularly strip-shaped wirings.

An aspect of the present disclosure provides a display panel. In the case where the display panel is applied to a display device equipped with an imaging element, the diffraction effect of light on the wirings may be reduced. Therefore, the adverse effect on the imaging effect caused by the diffraction effect of the wirings may be reduced, and at the same time, a full screen display may be realized.

Figure 7:
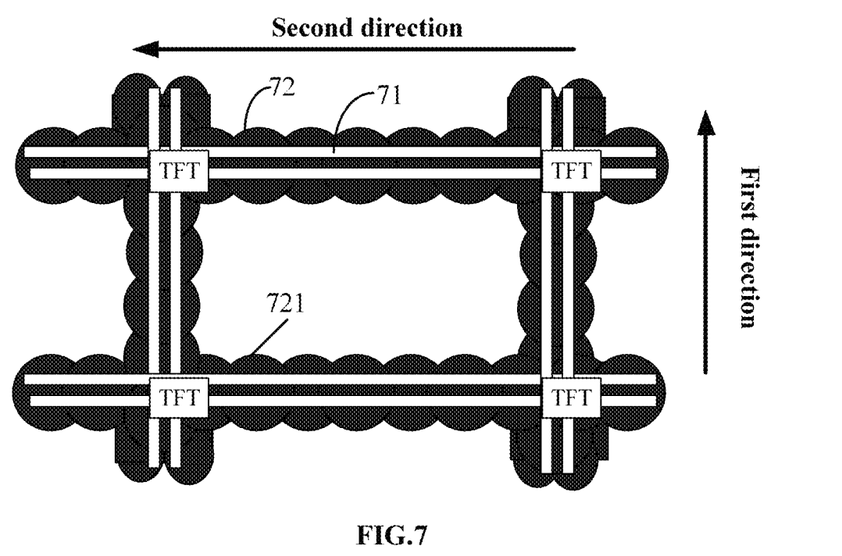
FIG. 7 schematically illustrates a partial structural view of a display panel in one or more embodiments of the present disclosure.

FIG. 7 schematically illustrates a partial structural view of a display panel in one or more embodiments of the present disclosure. As shown in FIG. 7, the display panel may include a plurality of wirings 71 extending parallel to a display surface of the display panel, and a plurality of light shielding portions 72 extending parallel to the display surface of the display panel. The projections of at least two wirings 71 of the plurality of wirings 71 extending parallel to each other on the display surface of the display panel are within the projection of a same light shielding portion 72 on the display surface. At least a portion of each light shielding portion 72 has a curved profile along the extending direction.

In some embodiments of the present disclosure, the extending direction may include at least one of a first direction and a second direction intersecting the first direction. As an example, the wirings 71 may include wirings extending in a first direction and wirings extending in a second direction. As yet another example, the wirings may be arranged only in the first direction or only in the second direction. The first direction and the second direction may be perpendicular to each other. In some embodiments of the present disclosure, the wirings 71 may include a plurality of gate lines, a plurality of data lines, and the like. The plurality of gate lines extend in one of the first direction and the second direction, and the plurality of data lines extend in the other of the first direction and the second direction. In addition, at the intersection of the wiring extending in the first direction and the wiring extending in the second direction, an electronic component such as a thin film transistor (TFT) may be provided.

As a non-limiting example, both the light shielding portion 72 and the wiring 71 may be made of a metal material. In this case, an insulating layer may be provided between the light shielding portion 72 and the wiring 71 to prevent the light shielding portion 72 from adversely affecting the transmission signal on the wiring 71. Alternatively, the light shielding portion 72 may also be formed of an insulating material.

In the case where a display panel provided according to some embodiments of the present disclosure is applied to a display device equipped with an imaging element, each light-shielding portion 72 may shield at least two wirings 71. Therefore, it is possible to prevent the ambient light from diffracting at the gap between the at least two wirings 71, thereby reducing the adverse effect on the imaging quality of the imaging element and the display effect of the display panel due to the diffraction of light. In addition, an object with a sharp boundary may also have a diffractive effect on light. In some embodiments of the present disclosure, the light shielding portions are designed to have a curved profile and the sharp boundaries of the light shielding portions may be at least partially eliminated. Therefore, it is possible to further reduce the diffraction phenomenon of light by the light shielding portions.

In some exemplary embodiments, as shown in FIG. 7, the curved profile of the light shielding portion 72 has, for example, a wave shape along the extending direction of the light shielding portion 72. As shown in FIG. 7, the wave-shaped curved profile may include a plurality of wave units 721. Since the light-shielding portion with a wavy profile has a relatively smooth boundary, the phenomenon of light diffraction can be reduced and the display effect of the display panel and the imaging quality of the imaging element can be improved.

Figure 8:
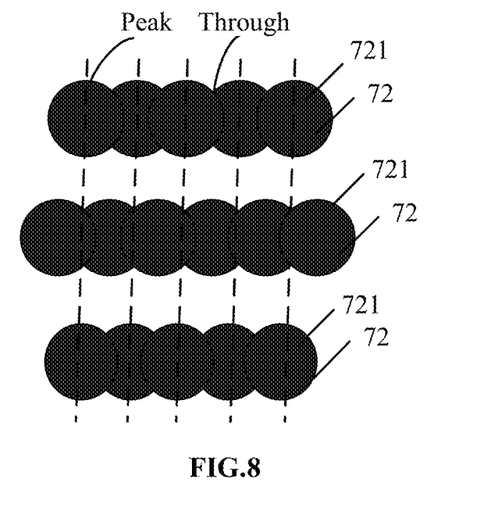
FIG. 8 schematically illustrates an example alignment relationship of peaks and troughs of adjacent wave-shaped light-shielding portions in one or more embodiments of the present disclosure.

In some embodiments, each light-shielding portion 72 has a symmetrical shape with respect to an axis parallel to a direction in which it extends. That is, the light-shielding portion 72 has an axisymmetric pattern. As shown in FIG. 7, a peak of the wave unit 721 of one of the two adjacent light-shielding portions 72 extending in parallel is aligned with a peak of the wave unit 721 of the other one of the two adjacent light-shielding portions in a direction perpendicular to the extending direction. As another example, a peak of the wave unit 721 of one of the two adjacent light-shielding portions 72 extending in parallel may not be aligned with a peak of the wave unit 721 of the other one of the two adjacent light-shielding portions in a direction perpendicular to the extending direction. FIG. 8 schematically illustrates an example alignment relationship of peaks and troughs of adjacent wave-shaped light shielding portions in one or more embodiments of the present disclosure. As shown in FIG. 8, peaks of the wave units 721 of one of the two adjacent light-shielding portions 72 with parallel extending directions are aligned with troughs of the wave units 721 of the other one of the two adjacent light-shielding portions in a direction perpendicular to extending directions.

Figure 9:
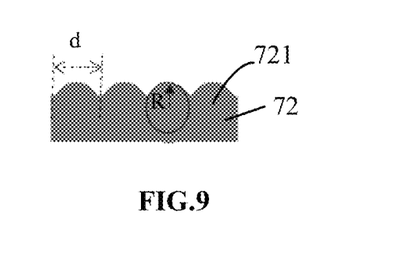
FIG. 9 schematically illustrates a portion of a wave-shaped curved profile in one or more embodiments of the present disclosure.

FIG. 9 schematically illustrates a portion of a wave-shaped curved profile in one or more embodiments of the present disclosure. As shown in FIG. 9, the curvature radius R of each wave unit 721 at the peak is in a range of 5-10 µm. The width d of each wave unit 721 is in a range of 4-7 µm. In the embodiments of the present disclosure, the width of each wave unit 721 is the distance between two adjacent peaks or troughs.

In some embodiments, a distance between two adjacent light shielding portions with parallel extending directions is greater than 80 µm. As another embodiment, a distance between two adjacent light shielding portions with parallel extending directions is greater than 120 µm. A large distance between adjacent light-shielding portions makes it is possible to reduce light diffraction at a gap between the light-shielding portions. It should be noted that in some embodiments of the present disclosure, a distance between two adjacent light shielding portions 72 with the same extending direction may refer to a straight-line distance between the closest edges of the two light shielding portions 72.

Figure 10:
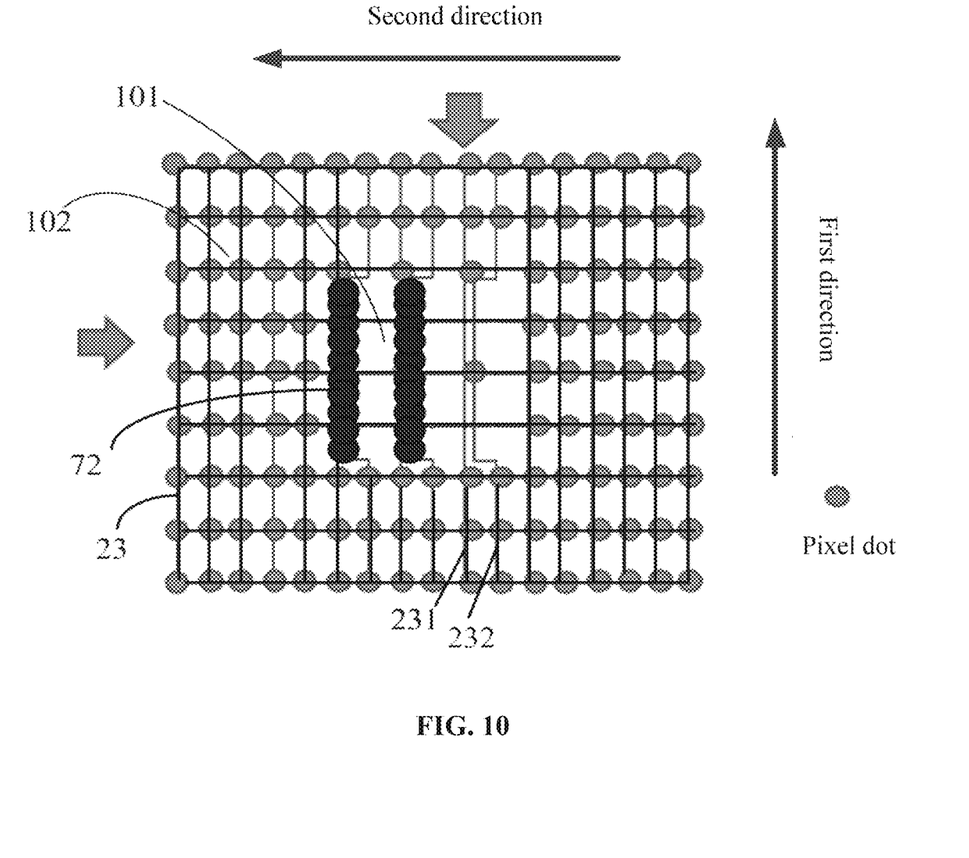
FIG. 10 schematically illustrates a partial structural view of another display panel in one or more embodiments of the present disclosure.

FIG. 10 schematically illustrates a partial structure view of another display panel in one or more embodiments of the present disclosure. As shown in FIG. 10, the another display panel has a first area 101 and a second area 102. The transmittance of the first area 101 is greater than the transmittance of the second area 102. In this embodiment, the light shielding portion 72 may be provided only in the first area 101. In an exemplary embodiment, the transmittance of the first area 101 may be increased by reducing the density of pixels in the first area 101, that is, the pixel density of the first area 101 is smaller than the pixel density of the second area 102. In this embodiment, the first area 101 may function as a transparent display area of the display panel, and the second area 102 may function as a non-transparent display area of the display panel.

As shown in FIG. 10, the at least two wirings corresponding to the same light shielding portion 72 may include a first wiring 231 and a second wiring 232 extending in the first direction. In this embodiment, in order to improve the display effect of the transparent display area and the imaging quality of the imaging element located behind the transparent display area, the second wiring 232 is closer to the first wiring 231 in the first area 101 in a second direction perpendicular to the first direction compared with other wires extending in the first direction. In addition, one of the first wiring 231 and the second wiring 232 may supply a signal to the same pixel of the first area 101. That is, both the first wiring 231 and the second wiring 232 may supply signals to the pixels in the first area 101, but not supply signals to a same pixel in the first area at the same time. In an exemplary embodiment, the first wiring 231 supplies a signal to the pixels in the first area 101 and the second area 102, and the second wiring 232 only supplies a signal to pixels in the second area 102 but not supplies a signal to pixels in the first area 101.

Figure 11:
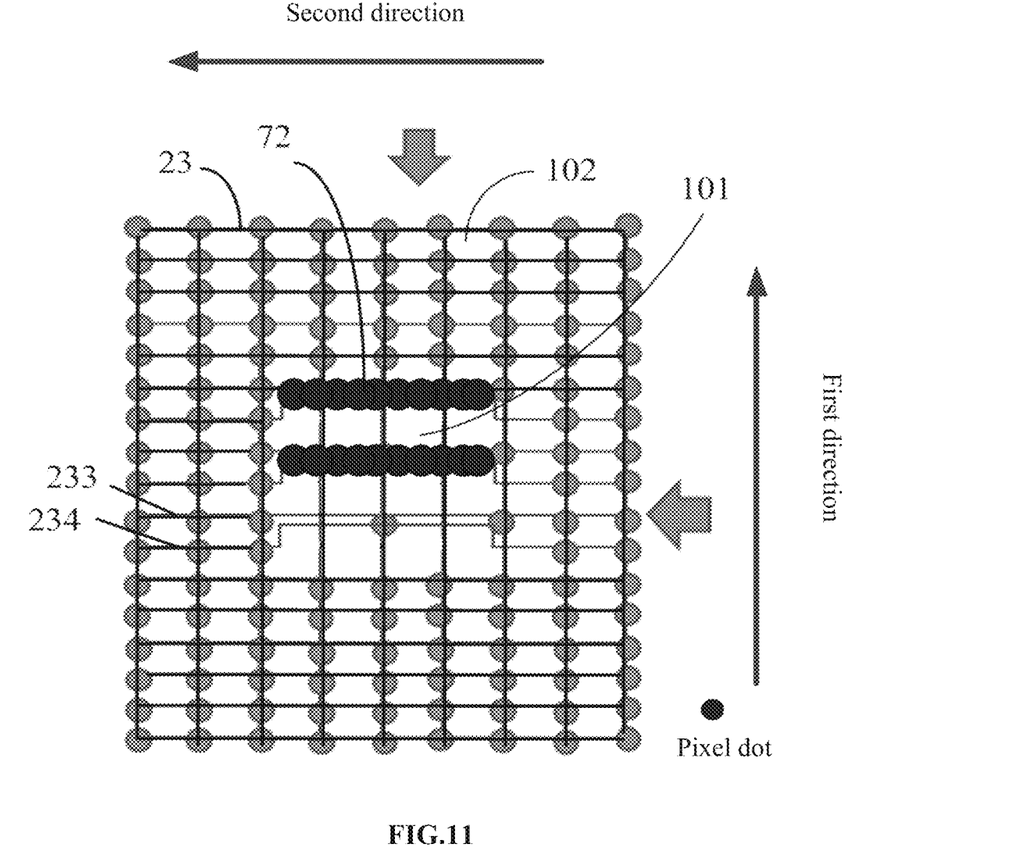
FIG. 11 schematically illustrates a partial structural schematic view of still another display panel in one or more embodiments of the present disclosure.

FIG. 11 schematically illustrates a partial structural view of still another display panel in one or more embodiments of the present disclosure. As shown in FIG. 11, the at least two wirings 23 corresponding to the same light shielding portion 72 may further include a third wiring 233 and a fourth wiring 234 extending in the second direction. In this embodiment, in order to improve the display effect of the transparent display area and the imaging quality of the imaging element located behind the transparent display area, the fourth wiring 234 is closer to the third wiring 233 in the first area 101 compared with other wirings extending in the second direction. In addition, one of the third wiring 233 and the fourth wiring 234 supplies a signal to the same pixel of the first area 101. That is, both the third wiring 233 and the second wiring 234 may supply signals to pixels in the first area 101, but do not supply signals to a same pixel in the first area 101 at the same time. In an exemplary embodiment, the third wiring 233 supplies a signal to pixels in the first area 101 and the second area 102, and the fourth wiring 234 only supplies a signal to pixels in the second area 102 but does not supply a signal to pixels in the first area 101.

In another embodiment, the display panels in the embodiments shown in FIGS. 10 and 11 may be combined. Specifically, the second wiring 232 is closer to the first wiring 231 in the first area 101 in a second direction perpendicular to the first direction compared to other wires extending in a first direction, while the fourth wiring 234 is closer to the third wiring 233 in the first area 101 in the first direction compared with other wirings extending in the second direction.

With the above configuration, the light shielding portion 72 shields the two wirings adjacent to each other, reducing the diffraction of light by the gap between the two wirings adjacent to each other. On the other hand, the use of the light-shielding portion 72 with a curved profile can also reduce the diffraction of light by the edges of the light-shielding portion itself. Therefore, the display effect of the transparent display area and the imaging effect of the imaging element can be further improved.

In an exemplary embodiment of the present disclosure, the first wiring 231 and the second wiring 232 may be one of a data line and a gate line, and the third wiring 233 and the fourth wiring 234 may be the other one of the data line and the gate line. It should be noted that, in some embodiments of the present disclosure, the types of wirings are not limited to gate lines and data lines, and may include any kind of wiring capable of providing signals to the display panel.

Figure 12:
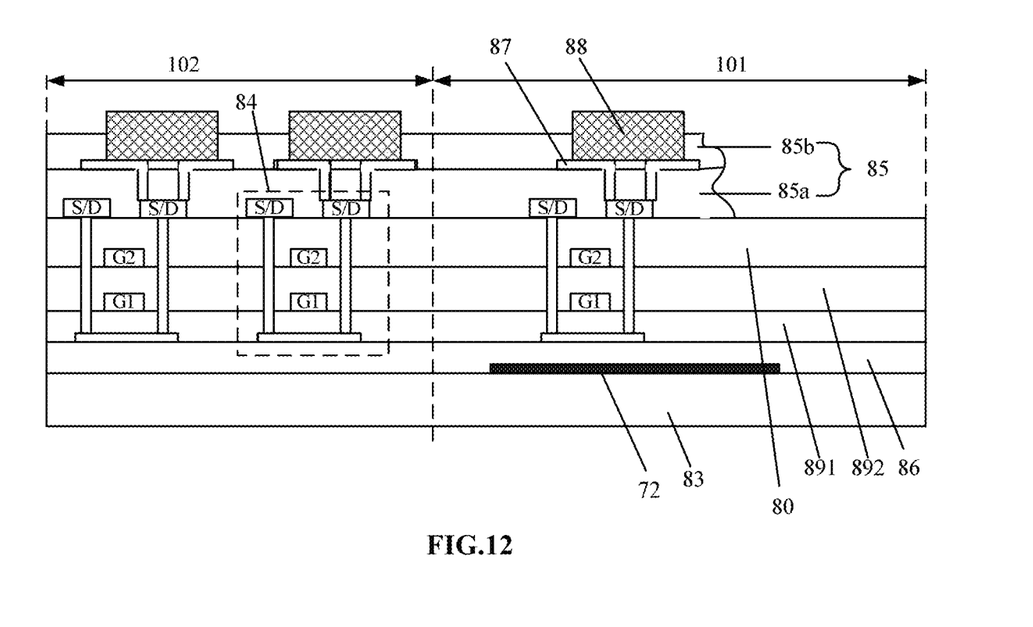
FIG. 12 schematically illustrates a cross-sectional view of a display panel in one or more embodiments of the present disclosure.

FIG. 12 schematically illustrates a cross-sectional view of a display panel in one or more embodiments of the present disclosure. As shown in FIG. 12, similar to the embodiments shown in FIGS. 10 and 11, the display panel has a first area 101 and a second area 102. The transmittance of the first area 101 is greater than the transmittance of the second area 102. In this embodiment, the light shielding portion 72 may be provided only in the first area 101.

The display panel may further include a first substrate 83 and a thin film transistor (TFT) 84 on the first substrate 83. The light shielding portion 72 is located on the first substrate 83 in the first area 101 and between the thin film transistor 84 and the first substrate 83. In this configuration, the light shielding portion 72 may also reduce the adverse effect on the imaging quality of the imaging element due to the reflection or diffraction of the ambient light by the thin film transistor 84.

As a non-limiting example, the first substrate 83 may be a transparent substrate, which may be made of a light-transmitting and non-metal material having rigidity such as glass, quartz, or transparent resin. Alternatively, the first substrate 83 may be a flexible substrate made of polyimide (PI).

The display panel may further include an additional layer 85 located in the second area 102 and extending to the first area 101. In this embodiment, the projection of an edge of the additional layer 85 close to the first area 101 on the display surface of the display panel is within the projection of the light shielding portion 72 on the display surface. With this arrangement, it is possible to further reduce the incidence of light into the imaging element on the back of the display panel due to the edge diffraction of the additional layer 85, thereby improving the imaging quality of the imaging element. In an exemplary embodiment, the additional layer 85 may include at least one of a planarization layer 85a and a pixel defining layer 85b.

As further shown in FIG. 12, the display panel may further include a buffer layer 86, an electrode layer 87, and a light emitting material layer 88. The buffer layer 86 is located on the light shielding portion 72. The planarization layer 85a is located on the thin film transistor 84. The electrode layer 87 is located on the planarization layer 85a. The pixel defining layer 85b has an open area and is located on the electrode layer 87. The luminescent material layer 88 is located in the open area of the pixel defining layer 85b. In an example embodiment, the electrode layer 87 is electrically connected to the source/drain electrode of the thin film transistor through a through hole penetrating the planarization layer 85*a*.

In the example embodiment shown in FIG. 12, the thin film transistor 84 is shown as a double-gate type. In this case, the display panel may further include a first gate insulation layer 891 between an active layer of the thin film transistor 84 and the first gate G1, a second gate insulation layer 892 between the first gate insulating layer 891 and the second gate G2 of the thin film transistor, and an interlayer dielectric layer 80 between the second gate G2 of the thin film transistor and the planarization layer 85*a*. It can be understood that, in the embodiments of the present disclosure, other types of thin film transistors may also be used, such as single-gate thin film transistors.

Figure 13:
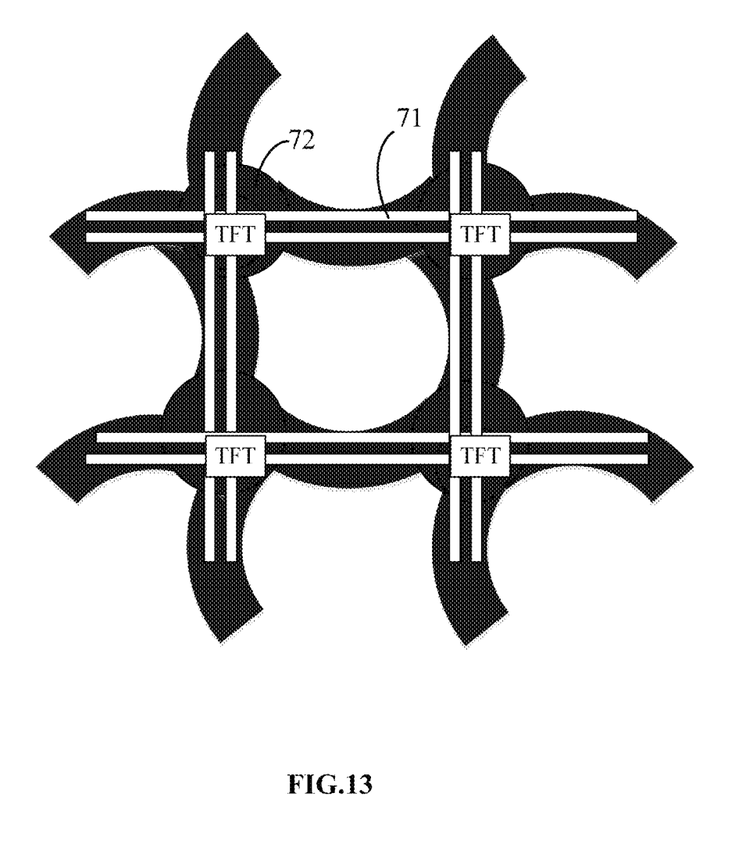
FIG. 13 schematically illustrates a partial structural view of still another display panel in one or more embodiments of the present disclosure.

FIG. 13 schematically illustrates a partial structural view of still another display panel in one or more embodiments of the present disclosure. In the embodiment shown in FIG. 13, the curved profile of the light shielding portion 72 may also be a profile defined by a plurality of arcs arranged in sequence along the extending direction of the light shielding portion 72. In the one or more embodiments, adjacent arcs of the plurality of arcs have opposite bending directions.

Figure 14:
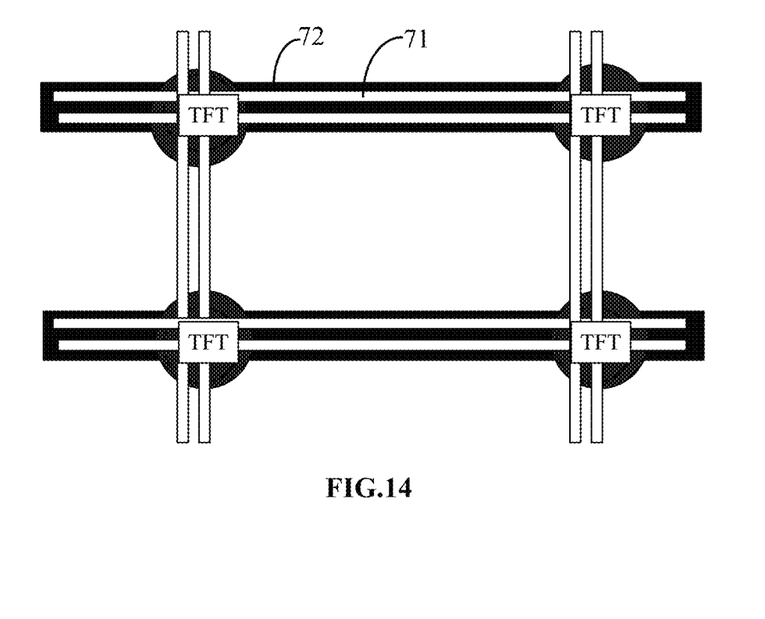
FIG. 14 schematically illustrates a partial structural view of still another display panel in one or more embodiments of the present disclosure.

FIG. 14 schematically illustrates a partial structure view of still another display panel in one or more embodiments of the present disclosure. As shown in FIG. 14, the curved profile of the light shielding portion 72 may be located only at a position where a pixel driving circuit (including a driving transistor) of each pixel is located, and a projection of the pixel driving circuit on the display surface of the display panel is located within a projection of the light shielding portion on the display surface. By way of example, the curved profile of the light shielding portion 72 may have a circular or oval shape.

It should be noted that, in order to demonstrate particular effects, advantages and feasibility of the present disclosure, the profile shape of the light shielding portion 72 is, in general, employed herein as an exemplary shape of the curved profile, however, not intended to limit the scope of the present disclosure to this specific profile shape. By virtue of these examples, the skilled person may rather easily recognize how to adapt the related parameters and conditions when employing a different shape of the curved profile.

In another aspect of the disclosure, a display device is disclosed. The display device may include a display panel according to the present disclosure, such as the display panel according to one or more embodiments disclosed in detail above. Therefore, for an alternative embodiment of the display device, reference may be made to the embodiments of the display panel.

Figure 15:
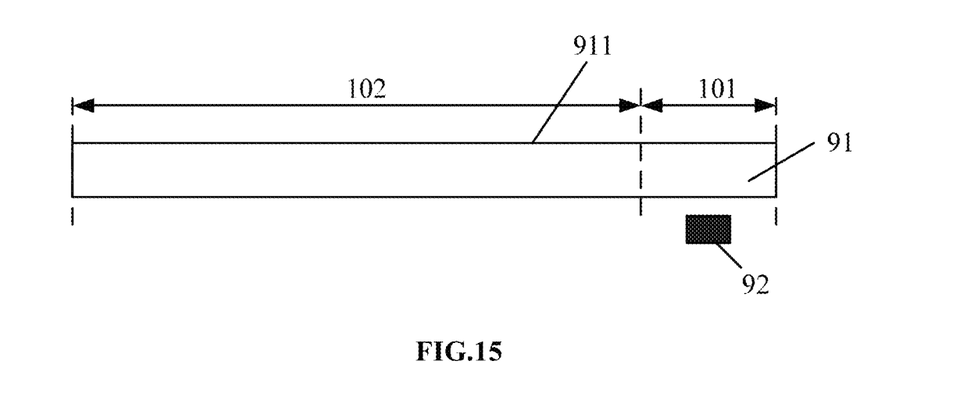
FIG. 15 schematically illustrates a display device in one or more embodiments of the present disclosure.

FIG. 15 schematically illustrates a display device in one or more embodiments of the present disclosure. As shown in FIG. 15, the display device includes a display panel 91 and an imaging element 92. In some embodiments, the display panel may be a display panel in any one of the embodiments shown in FIGS. 7 and 10-12. The display panel 91 may have a first area 101 and a second area 102. The transmittance of the first area 101 is greater than the transmittance of the second area 102. The light shielding portion 72 is provided only in the first area 101. The imaging element 92 is located on a side of the display panel 91 away from the display surface 911.

According to the display device provided by the embodiments of the present disclosure, each light-shielding portion 72 may shield at least two wirings 71, so that ambient light may be prevented from being diffracted at a gap between the at least two wirings 71. Therefore, the adverse effect on the imaging quality of the imaging element due to the diffraction of light may be reduced.

As used herein, the term "on" does not refer to a specific geometric orientation of the final stack of the display panel or display device relative to a direction of a gravitational force, but rather indicates a way of manufacturing the stack, which, after manufacturing, could, in general, be placed in any geometric orientation, also such as turned upside down.

Furthermore, when an element or layer is referred to as being "on" another element or layer, it may be directly on the other element or layer, or intervening elements or layers may be present. Likewise, when the element or layer is referred to as "under" another element or layer, it may be directly under the other element or layer, or there may be at least one intervening element or layer. When the element or layer is referred to as "between two elements or layers", it may be the only element or layer between the two elements or layers, or there may be more than one intermediate element or layer.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

Furthermore, when introducing elements and embodiments of the present disclosure, the articles "a," "an," "the," and "said" are intended to mean that there are one or more of the elements. Unless otherwise stated, "multiple" means two or more. The terms "first", "second", "third", etc. are used for descriptive purposes only, and cannot be understood to indicate or imply relative importance and order of formation.

The foregoing description of the embodiment has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A display panel, comprising:
   a first area and a second area, the second area being at least located on a side of the first area, and a transmittance of the first area being greater than a transmittance of the second area;
   a plurality of wirings at least located in the first area; and
   a light shielding portion at least located in the first area, at least part of the light shielding portion extending along a first direction, wherein orthographic projections of at least two of the plurality of wirings that extend along the first direction on the display panel are within an orthographic projection of the at least part of the light shielding portion on the display panel, and wherein the orthographic projection of the at least part of the light-shielding portion extending along the first direction on the display panel has a curved profile.

2. The display panel according to claim 1, wherein the at least two of the plurality of wirings comprise a gate line or a data line.

3. The display panel according to claim 1, wherein the curved profile is a wave shape.

4. The display panel according to claim 3, wherein the wave shape comprises a plurality of wave units, and a curvature radius of at least one of the plurality of wave units at a peak is in a range of 5-10 μm.

5. The display panel according to claim 4, wherein the at least part of the light shielding portion comprises a first part and a second part extending along the first direction and spaced apart along a second direction perpendicular to the first direction, and peaks of the wave units of the first part are not aligned with peaks of the wave units of the second part in the second direction.

6. The display panel according to claim 4, wherein the at least part of the light shielding portion comprises a first part and a second part extending along the first direction and spaced apart along a second direction perpendicular to the first direction, and peaks of the wave units of the first part are aligned with troughs of the wave units of the second part in the second direction.

7. The display panel according to claim 6, wherein a distance between the first part and the second part in the second direction is greater than 80 μm.

8. The display panel according to claim 7, wherein the distance between the first part and the second part in the second direction is greater than 120 μm.

9. The display panel according to claim 3, wherein the wave shape comprises a plurality of wave units, and a width of at least one of the plurality of wave units is in a range of 4-7 μm.

10. The display panel according to claim 3, wherein the at least part of the light shielding portion has a symmetrical shape with respect to an axis parallel to the first direction.

11. The display panel according to claim 1, wherein a pixel density of the first area is less than a pixel density of the second area.

12. The display panel according to claim 11, wherein the at least two of the plurality of wirings comprise a first wiring and a second wiring extending in the first direction, and wherein the second wiring is more adjacent to the first wiring in the first area in a second direction perpendicular to the first direction than other wirings extending in the first direction.

13. The display panel according to claim 12, further comprising a plurality of pixels located in the first area, wherein the first wiring and the second wiring are configured to provide a signal to different pixels of the plurality of pixels.

14. The display panel according to claim 13, wherein the at least two of the plurality of wirings comprise a third wiring and a fourth wiring extending in the second direction, and wherein the fourth wiring is more adjacent to the third wiring in the first area in the first direction than other wirings extending in the second direction.

15. The display panel according to claim 14, wherein the third wiring and the fourth wiring are configured to provide a signal to a different pixels of the plurality of pixels.

16. The display panel according to claim 15, wherein the first wiring and the second wiring are one of a data line and a gate line, and wherein the third wiring and the fourth wiring are the other one of the data line and the gate line.

17. The display panel according to claim 13, wherein at least one of the plurality of pixels comprises a thin film transistor located on a first substrate, wherein the light shielding portion is located between the thin film transistor and the first substrate, and wherein an orthographic projection of the thin film transistor on the display panel is within an orthographic projection of the light shielding portion on the display panel.

18. The display panel according to claim 1, further comprising an additional layer located in the second area and extending to the first area, wherein an orthographic projection of an edge of the additional layer close to the first area on the display panel is within an orthographic projection of the light shielding portion on the display surface.

19. A display device comprising the display panel according to claim 1.

20. The display device according to claim 19, further comprising an imaging element located on a side of the display panel away from a display surface, wherein an orthographic projection of the imaging element on the display panel is at least within the first area.

* * * * *

UNITED STATES PATENT AND TRADEMARK OFFICE
CERTIFICATE OF CORRECTION

| | |
|---|---|
| PATENT NO. | : 11,489,032 B2 |
| APPLICATION NO. | : 16/652576 |
| DATED | : November 1, 2022 |
| INVENTOR(S) | : Mingche Hsieh |

It is certified that error appears in the above-identified patent and that said Letters Patent is hereby corrected as shown below:

In the Claims

In Claim 15, Column 12, Line 15, delete "signal to a different pixels" and insert therefor -- signal to different pixels --.

Signed and Sealed this
Third Day of January, 2023

Katherine Kelly Vidal
*Director of the United States Patent and Trademark Office*